US009373685B2

(12) United States Patent
Shin et al.

(10) Patent No.: US 9,373,685 B2
(45) Date of Patent: Jun. 21, 2016

(54) GRAPHENE DEVICE AND ELECTRONIC APPARATUS

(71) Applicant: Samsung Electronics Co., Ltd., Suwon-Si, Gyeonggi-Do (KR)

(72) Inventors: Hyeon-jin Shin, Suwon-si (KR); Kyung-eun Byun, Uijeongbu-si (KR); Hyun-jae Song, Hwaseong-si (KR); Seong-jun Park, Seoul (KR); David Seo, Yongin-si (KR); Yun-sung Woo, Yongin-si (KR); Dong-wook Lee, Suwon-si (KR); Jae-ho Lee, Seoul (KR); Hyun-jong Chung, Hwaseong-si (KR); Jin-seong Heo, Seoul (KR); In-kyeong Yoo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/180,928

(22) Filed: Feb. 14, 2014

(65) Prior Publication Data
US 2014/0231752 A1    Aug. 21, 2014

(30) Foreign Application Priority Data

Feb. 15, 2013  (KR) .......................... 10-2013-0016596
Nov. 25, 2013  (KR) .......................... 10-2013-0143914

(51) Int. Cl.
*H01L 29/78*  (2006.01)
*H01L 29/16*  (2006.01)
(Continued)

(52) U.S. Cl.
CPC .......... *H01L 29/1606* (2013.01); *H01L 29/786* (2013.01); *H01L 29/78642* (2013.01); *H01L 29/78684* (2013.01); *H01L 31/028* (2013.01);
(Continued)

(58) Field of Classification Search
CPC ................ H01L 29/1606; H01L 29/66742; H01L 2924/13091; H01L 29/78; H01L 29/66045; H01L 51/0558; H01L 29/78696; H01L 29/41733; H01L 29/786; H01L 29/458
USPC ........................................................ 257/40
See application file for complete search history.

(56) References Cited

U.S. PATENT DOCUMENTS 4,721,983 A    1/1988  Frazier
6,621,145 B2   9/2003  Murota et al.
(Continued)

FOREIGN PATENT DOCUMENTS

KR    2013-0022854 A    3/2013
KR    20140045841 A     4/2014

OTHER PUBLICATIONS

Yang et al., "Graphene Barristor, a Triode Device with a Gate-Controlled Schottky Barrier", Science, vol. 336, pp. 1140-1143, Jun. 1, 2012.
(Continued)

*Primary Examiner* — Minh-Loan Tran
(74) *Attorney, Agent, or Firm* — Harness, Dickey & Pierce, P.L.C.

(57) ABSTRACT

A graphene device and an electronic apparatus including the same are provided. According to example embodiments, the graphene device includes a transistor including a source, a gate, and a drain, an active layer through which carriers move, and a graphene layer between the gate and the active layer. The graphene layer may be configured to function both as an electrode of the active layer and a channel layer of the transistor.

27 Claims, 13 Drawing Sheets

(51) Int. Cl.

| | |
|---|---|
| *H01L 51/00* | (2006.01) |
| *H01L 51/42* | (2006.01) |
| *H01L 51/50* | (2006.01) |
| *H01L 51/05* | (2006.01) |
| *H01L 29/786* | (2006.01) |
| *H01L 31/028* | (2006.01) |
| *H01L 33/34* | (2010.01) |
| *H01L 31/08* | (2006.01) |

(52) U.S. Cl.
CPC ............... *H01L 31/08* (2013.01); *H01L 33/34* (2013.01); *H01L 51/0046* (2013.01); *H01L 51/0504* (2013.01); *H01L 51/0558* (2013.01); *H01L 51/0566* (2013.01); *H01L 51/428* (2013.01); *H01L 51/50* (2013.01); *H01L 51/057* (2013.01); *H01L 51/0562* (2013.01)

(56) References Cited

U.S. PATENT DOCUMENTS

| | | |
|---|---|---|
| 7,327,000 B2 | 2/2008 | DeHeer et al. |
| 8,178,862 B2 | 5/2012 | Colinge |
| 8,247,806 B2 | 8/2012 | Chae et al. |
| 9,105,556 B2 | 8/2015 | Heo et al. |
| 2010/0258787 A1 | 10/2010 | Chae et al. |
| 2011/0220865 A1 | 9/2011 | Miyata et al. |
| 2012/0032227 A1 | 2/2012 | Seabaugh et al. |
| 2013/0048951 A1 | 2/2013 | Heo et al. |
| 2014/0022025 A1* | 1/2014 | Jenkins et al. .......... 331/116 FE |
| 2014/0158989 A1 | 6/2014 | Byun et al. |

OTHER PUBLICATIONS

Yang et al., "Supplementary Materials for Graphene Barristor, a Triode Device with a Gate-Controlled Schottky Barrier", Science Express, May 17, 2012.

Han, et al. "Extremely efficient flexible organic light-emitting diodes with modified graphene anode", Nature Photonics, vol. 6, pp. 105-110, (2012).

Jeon, et al. "Nanopillar InGaN/GaN light emitting diodes integrated with homogeneous multilayer graphene electrodes", Journal of Materials Chemistry, vol. 21, pp. 17688-17692, (2011).

* cited by examiner

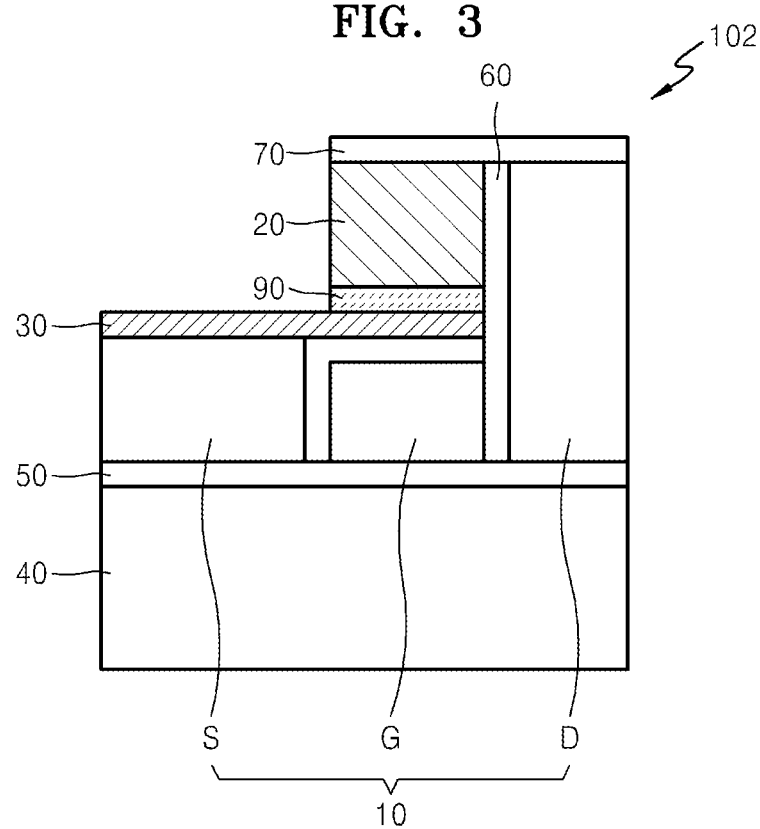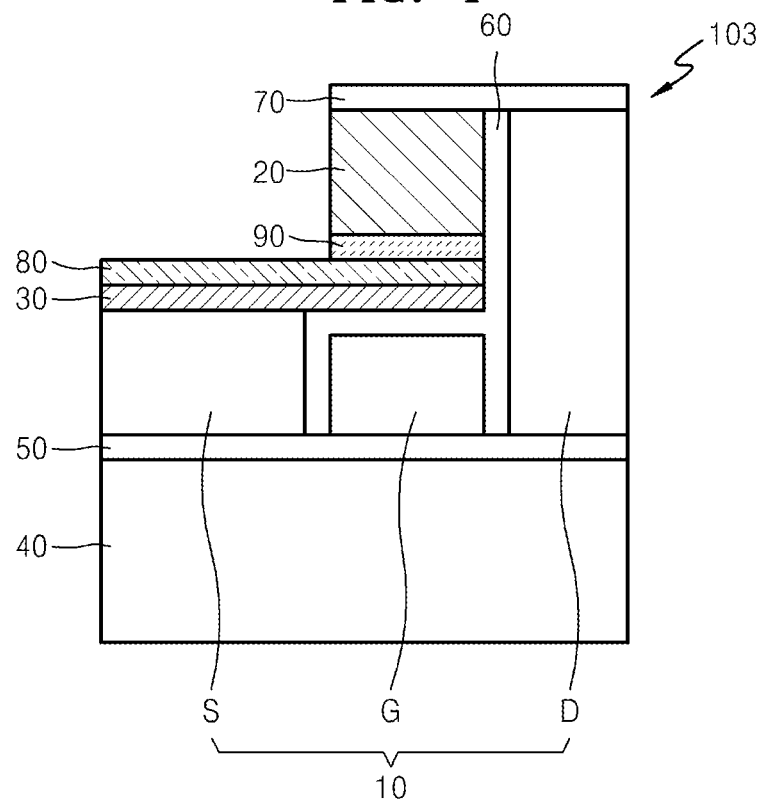

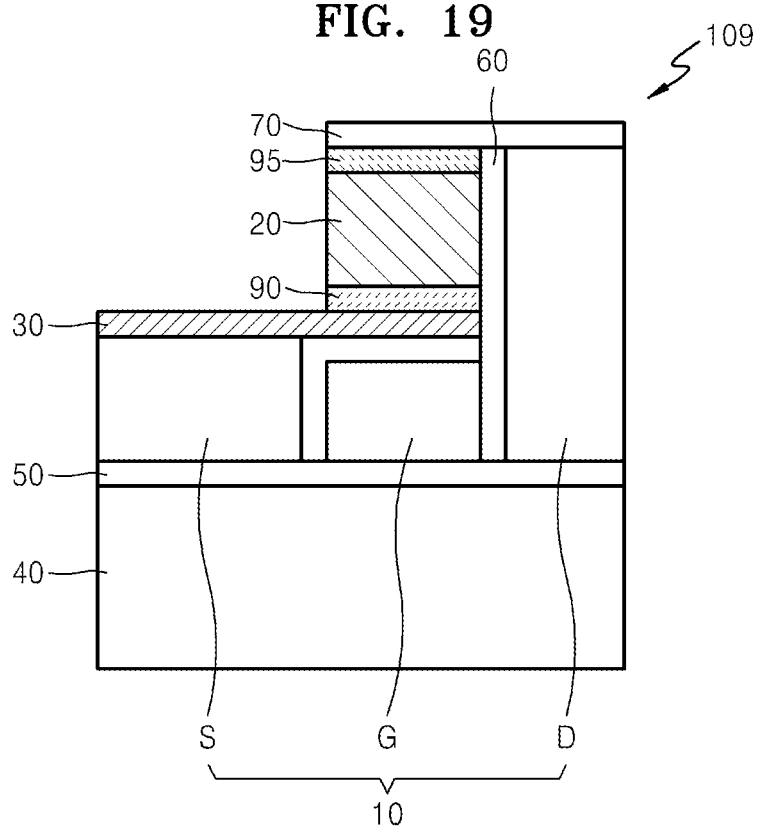
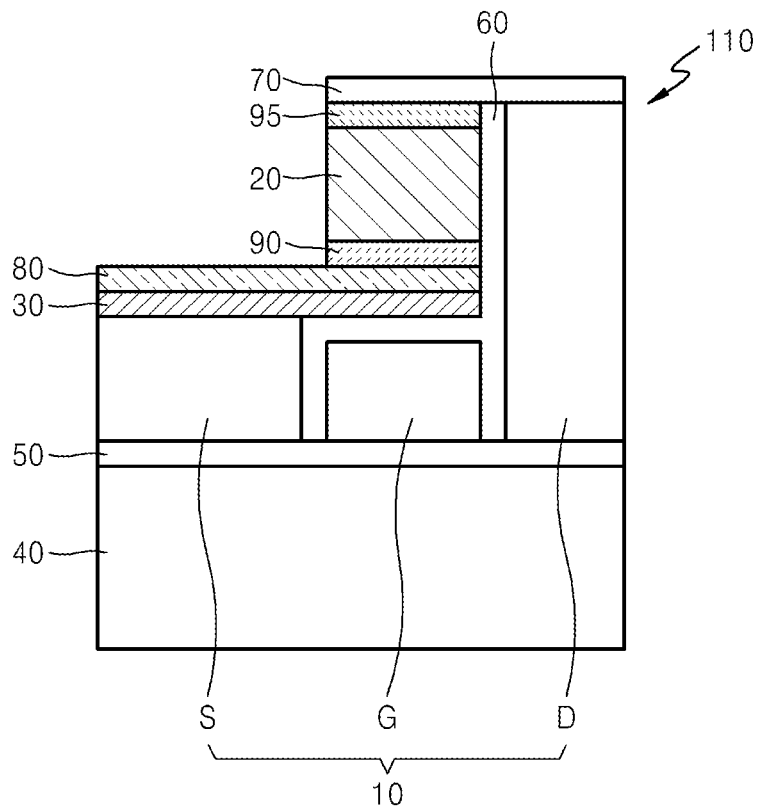

1

GRAPHENE DEVICE AND ELECTRONIC APPARATUS

RELATED APPLICATION

This application claims priority under 35 U.S.C. §119 to Korean Patent Application No. 10-2013-0016596, filed on Feb. 15, 2013 and Korean Patent Application No. 10-2013-0143914, filed on Nov. 25, 2013, in the Korean Intellectual Property Office. Each of the above-referenced applications incorporated herein in its entirety by reference.

BACKGROUND

1. Field

The present disclosure relates to a graphene device including graphene and/or an electronic apparatus including the same.

2. Description of Related Art

Semiconductor devices on a silicon substrate are rapidly becoming highly integrated and have been developed to have high performance. However, due to the characteristics of silicon and limitations in the manufacturing processes for silicon, improving the performance of the semiconductor devices has been limited. Accordingly, research has gone into a next generation device that may go beyond the limitation of the semiconductor devices on a silicon substrate.

Graphene has received attention as a next generation material in various fields. Graphene is a material formed of carbon atoms connected in a hexagonal shape on a flat surface, and may be as thin as an atomic layer. Theoretically, graphene may have an electrophoretic mobility of up to about 200,000 $cm^2$/Vs, which is at least 100 times faster than that of single crystal silicon (Si) used mainly as a semiconductor. Graphene may be capable of releasing electricity at a rate that is at least 100 times greater than that of copper (Cu). Thus, Graphene has received attention as a basic material for electronic circuits.

Research has gone into a device including the graphene.

SUMMARY

Example embodiments relate to a graphene device in which a graphene layer is capable of performing a dual function.

Example embodiments also relate to an electronic apparatus including the graphene device.

Additional aspects will be set forth in part in the description which follows and, in part, will be apparent from the description, or may be learned by practice of example embodiments.

According to example embodiments, a graphene device includes: an active layer; a graphene layer contacting the active layer; and a first electrode spaced apart from the graphene layer. The graphene layer and the active layer may be configured to provide a pathway for current flow. The first electrode may be configured to control a work function of the graphene layer according to a voltage applied to the first electrode. The active layer may be on the first electrode In example embodiments, the graphene device may further include a second electrode contacting the active layer. In example embodiments, the graphene layer may further include a third electrode contacting the graphene layer. The graphene device may be configured to have the current flow to and from the graphene layer.

The third electrode may be one of a source electrode of the transistor and a drain electrode of the transistor.

In example embodiments, the graphene layer may be a channel of a transistor, and the first electrode may be a gate of the transistor.

In example embodiments, a second electrode may contact the active layer. A polarity of carriers moving from the active layer to the graphene layer may be opposite to a polarity of carriers moving from the active layer to the second electrode. A polarity of carriers moving in the graphene layer may change according to the polarity of a voltage applied to the first electrode.

In example embodiments, if the voltage applied to the first electrode is positive, the carriers moving in the graphene layer may be electrons. If the voltage applied to the first electrode is negative, the carriers moving in the graphene layer may be holes.

In example embodiments, the first electrode may be configured to change an energy barrier between the graphene layer and the active layer, based on the applied to the first electrode.

In example embodiments, the first electrode may be configured to increase a movement of holes to the active layer in response to an increase in the work function of the graphene layer if the voltage applied to the first electrode is negative.

In example embodiments, the first electrode is configured to increase a movement of electrons to the active layer in response to a decrease in the work function of the graphene layer if the voltage applied to the first electrode is positive.

In example embodiments, the active layer may overlap at least a portion of the first electrode.

In example embodiments, the graphene device may further include a semiconductor layer contacting the graphene layer.

In example embodiments, the semiconductor layer may be between the graphene layer and the active layer.

In example embodiments, the active layer may include an emission layer that is configured to emit light.

In example embodiments, the graphene device may be an emission device.

In example embodiments, the active layer may include a photoconductive layer, the photoconductive layer may be configured to react with light, and the photoconductive layer may be configured to photoelectrically convert light.

In example embodiments, the graphene device may be a detection device.

In example embodiments, an electronic apparatus may include at least one of the graphene device.

According to example embodiments, a graphene device includes: a transistor including a source, a gate, and a drain; an active layer on the gate; and a graphene layer between the gate and the active layer. The graphene layer may be configured to function both as an electrode of the active layer and a channel layer of the transistor.

In example embodiments, the graphene layer may be in contact with one of the source and the drain, and the graphene layer may be spaced apart from an other of the source and the drain.

In example embodiments, the graphene device may further include an active electrode contacting the active layer, and the active electrode may be configured to form an electric field on the active layer based on a voltage applied to the graphene layer.

In example embodiments, the active electrode may be one of the source and the drain.

In example embodiments, the gate may be configured to change a work function of the graphene layer according to a voltage applied to the gate.

In example embodiments, the gate may be configured to change an energy barrier between the graphene layer and the active layer according to a voltage applied to the gate.

In example embodiments, the active layer may include an emission layer that is configured to emit light.

In example embodiments, the active layer may include a photoconductive layer, the photoconductive layer may be configured to react with light, and is the photoconductive layer may be configured to photoelectrically convert light.

According to example embodiments, a graphene device includes: a first electrode; a graphene layer on the first electrode, the first electrode spaced apart from the graphene layer, the first electrode configured to control a work function of the graphene layer according to a voltage applied to the first electrode; an active layer contacting the graphene layer; and a second electrode on the active layer, the active layer being between the graphene layer and the second electrode.

In example embodiments, the graphene device may further include a third electrode contacting the graphene layer, and an insulating layer. The insulating layer may extend between the third electrode and the first electrode, and the insulating layer may extend between the graphene layer and the first electrode.

In example embodiments, the graphene device may further include a fourth electrode contacting the insulating layer. The insulating layer may extend between the fourth electrode and the active layer. The insulating layer may extend between the fourth electrode and the graphene layer. The insulating layer may extend between the graphene layer and the first electrode.

In example embodiments, the first electrode may be between the third electrode and the fourth electrode.

In example embodiments, the graphene device may further include a semiconductor layer between the active layer and the graphene layer.

In example embodiments, the first electrode may be configured to increase a work function of the graphene layer if a negative voltage is applied to the first electrode, and the first electrode may be configured to decrease a work function of the graphene layer if a positive voltage is applied to the first electrode.

In example embodiments, the first electrode may be a gate of a transistor, and the graphene layer may be configured to function both as an electrode of the active layer and a channel of the transistor.

According to example embodiments, a method of operating a graphene device include changing a work function of a graphene layer. The graphene device may include a first electrode; the graphene layer on the first electrode, the first electrode spaced apart from the graphene layer, the first electrode configured to control a work function of the graphene layer according to a voltage applied to the first electrode; an active layer contacting the graphene layer; and a second electrode on the active layer, the active layer being between the graphene layer and the second electrode. The method of operating the graphene device may include changing the work function of the graphene layer by applying one of a negative voltage and a positive voltage to the first electrode.

In example embodiments, the changing the work function of the graphene layer may include increasing the work function of the graphene layer by applying the negative voltage to the first electrode.

In example embodiments, the changing the work function of the graphene layer may include decreasing the work function of the graphene layer by applying the positive voltage to the first electrode.

In example embodiments, the first electrode may be a gate of a transistor. The method may further include configuring the graphene layer as both an electrode of the active layer and a channel of the transistor.

In example embodiments, the active layer may include a photoconductive material.

In example embodiments, the graphene device may include a semiconductor layer between the active layer and the graphene layer.

According to example embodiments, a method of manufacturing a graphene device includes: forming a transistor, the transistor including a graphene layer on a gate electrode; and forming an active layer on the graphene layer. The graphene layer is spaced apart from the gate electrode. The gate electrode is configured to control a work function of the graphene layer based on a voltage applied to the gate electrode. The active layer contacts the graphene layer. The graphene layer may be configured to function both as an electrode of the active layer and a channel of the transistor.

In example embodiments, an active electrode contacting the active layer may be formed. The active electrode may be one of a source electrode of the transistor and a drain electrode of the transistor.

In example embodiments, the transistor may include a source electrode and a drain electrode. The graphene layer may be in contact with one of the source and drain electrodes.

In example embodiments, the method may include forming a semiconductor layer between the active layer and the graphene layer.

BRIEF DESCRIPTION OF THE DRAWINGS

These and/or other aspects will become apparent and more readily appreciated from the following description of non-limiting embodiments, as illustrated in the accompanying drawings in which like reference characters refer to like parts throughout the different views. The drawings are not necessarily to scale, emphasis instead being placed upon illustrating principles of inventive concepts. In the drawings:

FIGS. 3 and 4 are schematic cross-sectional views of graphene devices according to example embodiments;

FIGS. 19 to 21 are schematic cross-sectional views of graphene devices according to example embodiments.

DETAILED DESCRIPTION

Figure 1:
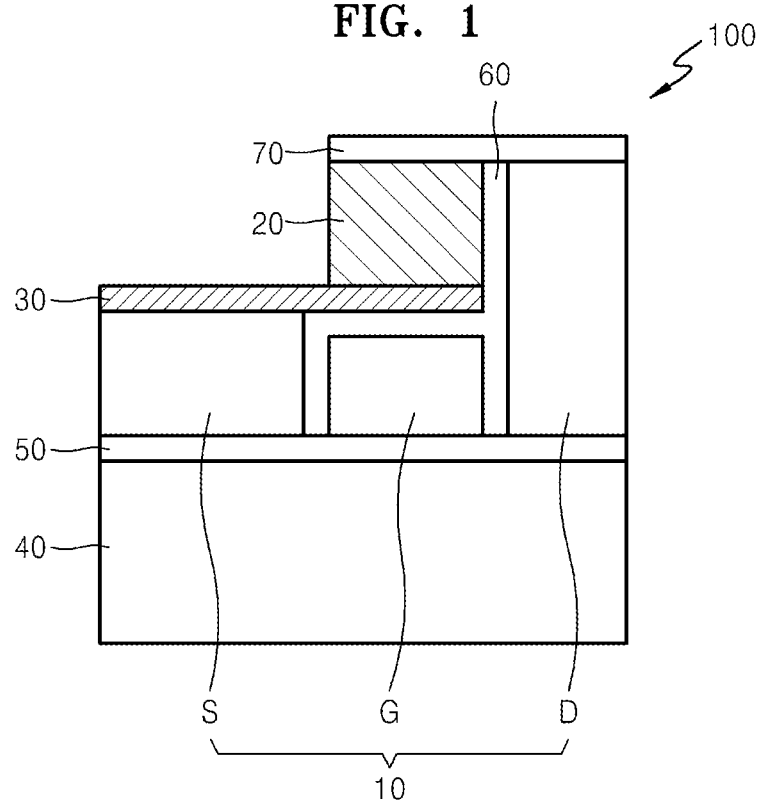
FIG. 1 is a schematic cross-sectional view of a graphene device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a graphene device according to example embodiments.

As shown in FIG. 1, the graphene device 100 includes a transistor 10 including a source S, a gate G, and a drain D, an active layer 20 through which carriers move, and a graphene layer 30 disposed between the gate G and the active layer 20 and serving as an electrode of the active layer 20 and a channel layer of the transistor 10. The graphene device 100 may further include an active electrode 70 contacting the active layer 20 and forming an electric field on the active layer 20 due to a voltage applied to the graphene layer 30. Here, the movement of carriers refers to a flow of electrical currents. Also, the active layer 20, the graphene layer 30, and the active electrode 70 or other electrodes, through which the carriers may move, that is, through which currents may flow, may be referred to as providing a pathway for the current flow. The active layer 20 may be between the graphene layer 30 and the active electrode 70.

The graphene device 100 is disposed on a substrate 40, which may be formed of a $SiO_2$-based transparent glass material. The substrate 40 is not limited thereto and may be formed of a transparent plastic material. In this case, the plastic material forming the substrate 40 may be one or more materials that are selected from various organic materials.

A buffer layer 50 may be further disposed on the substrate 40. The buffer layer 50 limits (and/or prevents) an impurity from permeating the substrate 40 and planarizes the top surface of the substrate, and thus may be formed of various materials that may perform these functions. For example, the buffer layer 50 may contain an inorganic material, such as silicon oxide, silicon nitride, silicon oxynitride, aluminum oxide, aluminum nitride, titanium oxide or titanium nitride, or an organic material, such as polyimide, polyester, or acryl and may be formed as their lamination. In addition, the buffer layer 50 may optionally be omitted according to processing conditions since it is not an essential component.

The source S, the gate G, and the drain D may be arranged to be spaced apart from one another on the buffer layer 50. The source S, the gate G, and the drain D may be formed of a conductive material. For example, they may be formed of a metal material or conductive oxide. The source S, the gate G, and the drain D may be formed on the same plane. For example, the source S, the gate G, and the drain D may be simultaneously formed on the buffer layer 50 or the substrate 40, and thus, the manufacture of the transistor 10 is simple.

In order to limit (and/or prevent) currents from flowing between the gate G and the source S and between the gate G and the drain D, an insulating layer 60 that covers the gate G may be disposed on the buffer layer 50. The insulating layer 60 may be formed of an insulating material that includes at least one of inorganic insulating layers, such as zirconium dioxide ($ZrO_2$), titanium dioxide ($TiO_2$), magnesium oxide (MgO), cerium oxide ($CeO_2$), aluminum oxide ($Al_2O_3$), hafnium oxide ($HfO_2$), niobium oxide (NbO), silicon dioxide (SiO2), and silicon nitride ($Si_3N_4$), organic insulating layers, such as poly vinylphenol (PVP), poly methyl-methacrylate (PMMA), poly vinylalcohol (PVA), and benzocylobutene (BCB), and an organic and inorganic hybrid.

Meanwhile, the graphene layer 30 is disposed on a region of the insulating layer 60 that faces the gate G. The graphene is very stable structurally and chemically, has excellent light absorption, and is highly efficient in transducing light into heat and in transferring the heat. Graphene manufactured by chemical vapor deposition (CVD) is transferred and then patterned in order to form the graphene layer 30. Alternatively, graphene may be thinned by being chemically separated from graphite in order to be used.

The graphene layer 30 may be disposed to be spaced apart from one of the source S and the drain D, while contacting the other of the source S and the drain D. For example, the graphene layer 30 may extend toward the source S to contact the source S, and may be disposed to be spaced apart from the drain D. The graphene layer 30 according to example embodiments is a pathway through which carriers move, and may serve as a channel layer of the transistor 10.

The active electrode 70 forms an electric field on the active layer 20 due to a voltage formed between the active layer 20 and the graphene layer 30. The active electrode 70 may be electrically connected with the drain D. The active electrode 70 may be formed of a metal material or conductive oxide. It is illustrated in FIG. 1 that the drain D and the active electrode 70 are formed as separate layers and are electrically connected to each other while contacting each other, but it is not limited thereto. The drain D itself may function as the active electrode 70. In this case, the active electrode 70 is not additionally needed.

The active layer 20 may emit or absorb light due to a voltage generated between the graphene layer 30 and the active electrode 70. Depending on the type of device that the graphene device 100 will be used as, materials of the active layer 20 may be different. For example, the active layer 20 may include an emission layer and a photoconductive layer. Aspects with respect to the active layer 20 will be described later on.

Meanwhile, an energy barrier between the graphene layer 30 and the active layer 20 is controlled according to a voltage applied to the gate G. For example, a work function of the graphene layer 30 changes depending on the voltage applied to the gate G, and thus the voltage applied to the gate controls the energy barrier between the graphene layer 30 and the active layer 20.

For example, in the case where carriers are holes, if a negative voltage −Vg is applied to the gate G when a given voltage is applied to the drain D (when a charge (a negative charge) is injected in the drain D and the source S is grounded), the holes of the graphene layer 30 are induced and thus the work function increases. The increase in the work function of the graphene layer 30 leads to a decrease in the size of the energy barrier between the graphene layer 30 and the active layer 20 so that the holes may easily move to the active layer 20.

On the contrary, if a given positive voltage +Vg is applied to gate G when a given voltage is applied to the source S and the drain D, electrons are induced on the surface of the graphene layer 30 and thus the work function of the graphene layer 30 decreases. The decrease in the work function of the graphene layer 30 leads to an increase in the size of the energy barrier between the graphene layer 30 and the active layer 20 so that the holes are limited (and/or prevented) from easily moving to the active layer 20.

As the negative voltage −Vg increases, the number of the holes that are capable of moving to the active layer 20 increases. Also, when the voltage is more than or equal to a reference voltage, the holes may move to the active layer 20. Thus, the graphene layer 30 may serve not only as the channel layer of the transistor 10 but also as an electrode of the active layer 20.

Figure 2:
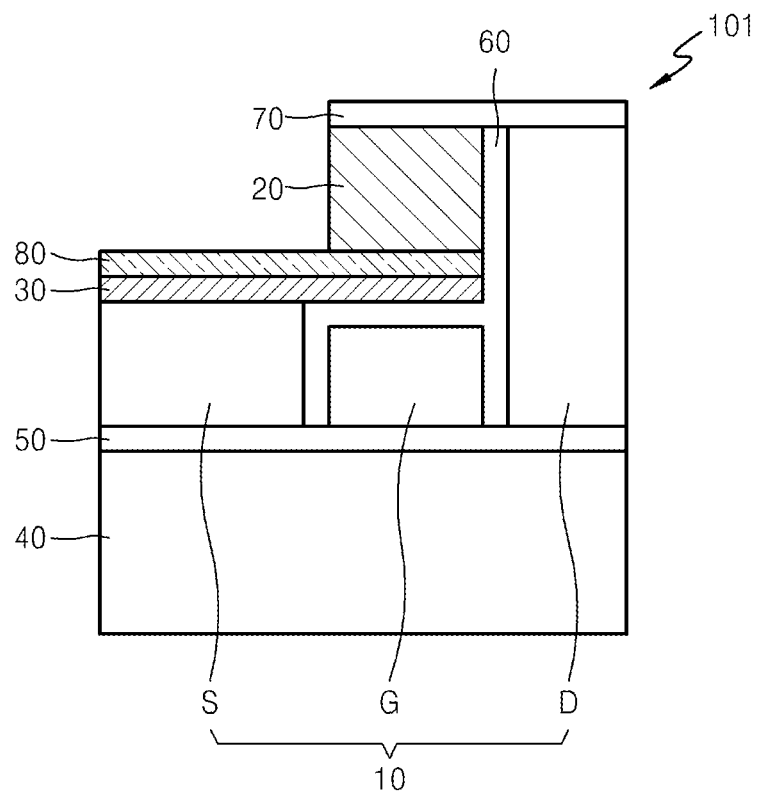
FIG. 2 is a schematic cross-sectional view of a graphene device according to example embodiments.

Meanwhile, the graphene device according to example embodiments may further include a semiconductor layer. FIG. 2 is a schematic cross-sectional view of a graphene device 101 according to example embodiments. As shown in FIG. 2, the graphene device 101 may further include a semiconductor layer 80 contacting the graphene layer 30. The semiconductor layer 80 may be disposed between the graphene layer 30 and the active layer 20. Alternatively, when the semiconductor layer 80 is formed between the graphene layer 30 and the active layer 20, an electrode layer (not shown) may be additionally disposed between the semiconductor layer 80 and the active layer 20 to promote the injection of holes into the active layer 20.

The semiconductor layer 80 may be formed of various semiconductor materials. For example, the semiconductor layer 80 may be formed of silicon, germanium, silicon-germanium, III group to V group semiconductor materials, II group to VI group semiconductors, or an organic semiconductor, and may be doped with n-type or p-type dopant. The type of dopant may be determined depending on the type of carriers (for example, electrons or holes). The semiconductor layer 80 may increase the selectivity of materials contacting graphene, in order to enhance a material characteristic of the graphene device 101, such as an interface characteristic of the graphene layer 30.

FIGS. 3 and 4 are schematic cross-sectional views of a graphene device 102 according to example embodiments. As shown in FIG. 3, the graphene device 102 may further include an injection layer 90 between the graphene layer 30 and the active layer 20. The injection layer 90 is a polarized channel and may complement coarseness of lower layers such as the graphene layer 30 and the semiconductor layer 80 and, together with the active layer 20, may control injection of holes or electrons. The injection layer 90 may be formed of a material that is a phthalocyanine compound such as copper phthalocyanine, or starburst-type amines such as TCTA, m-MTDATA, or m-MTDAPB, lithium fluoride (LiF), sodium chloride (NaCl), cesium fluoride (CsF), lithium oxide (Li2O), barium oxide (BaO), Liq, etc. Alternatively, as shown in FIG. 4, the graphene device 103 may include both the semiconductor layer 80 and the injection layer 90.

FIGS. 3 and 4 illustrate the injection layer 90 as a different layer from the active layer 20. However, it is not limited thereto. The injection layer 90 may be included in the active layer 20.

According to example embodiments, the active electrode 70 and the drain D are shown as separate components for convenience of description. The active electrode 70 and the drain D may be formed of the same conductive material, and one layer may function as the active electrode 70 and the drain D.

Although FIGS. 1-4 illustrate graphene devices 100 to 104, where the graphene layer 30 contacts the source electrode S, example embodiments are not limited thereto. For example, FIGS. 17 and 18 are schematic cross-sectional views of graphene devices according to example embodiments.

Figure 17:
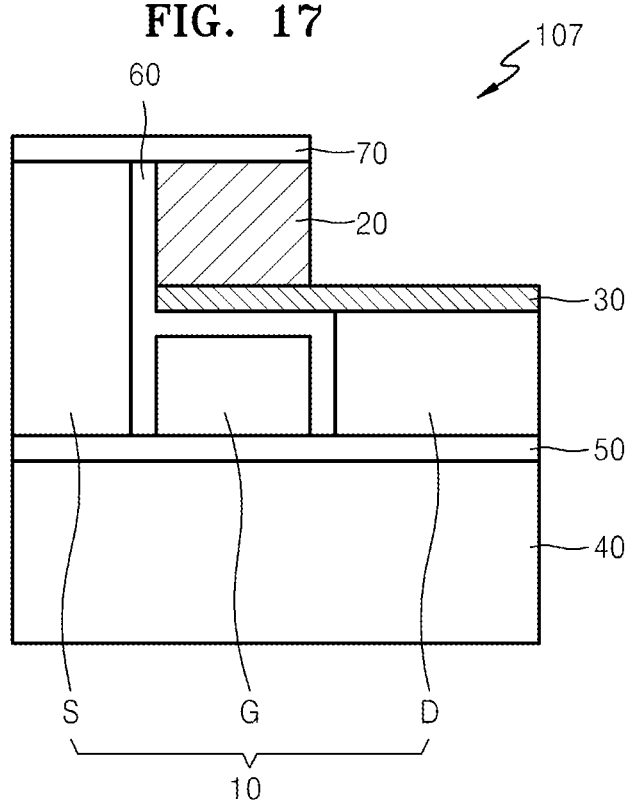
FIGS. 17 and 18 are schematic cross-sectional views of graphene devices according to example embodiments.
Figure 18:
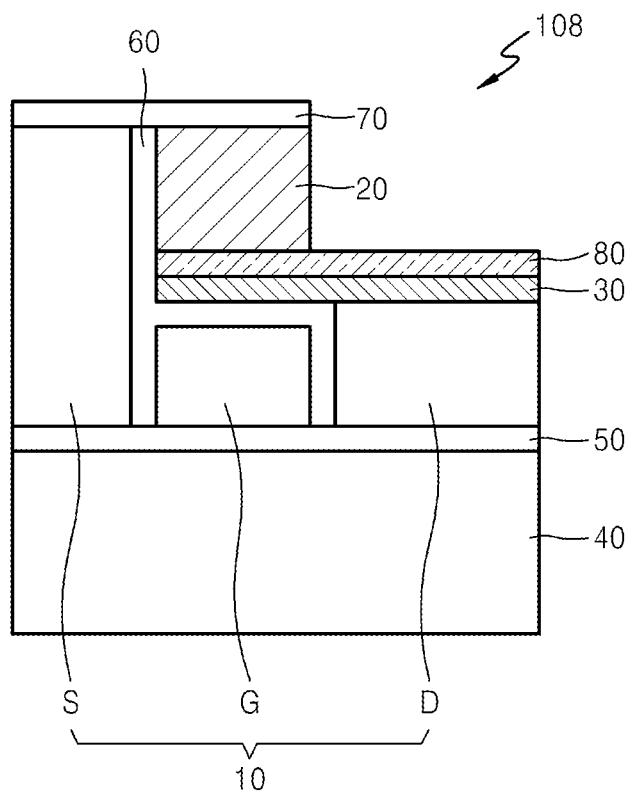

The graphene device 107 illustrated in FIG. 17 is similar to the graphene device 100 illustrated in FIG. 1, except in the graphene device 107, the graphene layer 30 contacts the drain electrode D instead of the source electrode S, the active electrode 70 contacts the source electrode S instead of the drain electrode D, the insulating layer 60 extends between the active layer 20 and the source electrode S, the insulating layer 60 extends between the graphene layer 30 and the source electrode S, and the source electrode S may be larger than the drain electrode D. The graphene device 108 illustrated in FIG. 18 may be the same as the graphene device 107 illustrated in FIG. 17, except the graphene device 108 may further include a semiconductor layer 80 contacting the graphene layer 30. The semiconductor layer 80 may be between the graphene layer 30 and the active layer 20. The graphene device 107 in FIG. 17 may further include an injection layer (see injection layer 90 in FIGS. 3-4) between the active layer 20 and the graphene layer 30. The graphene device 108 in FIG. 18 may further include an injection layer (see injection layer 90 in FIGS. 3-4) between the active layer 20 and the semiconductor layer 80.

Figure 5:
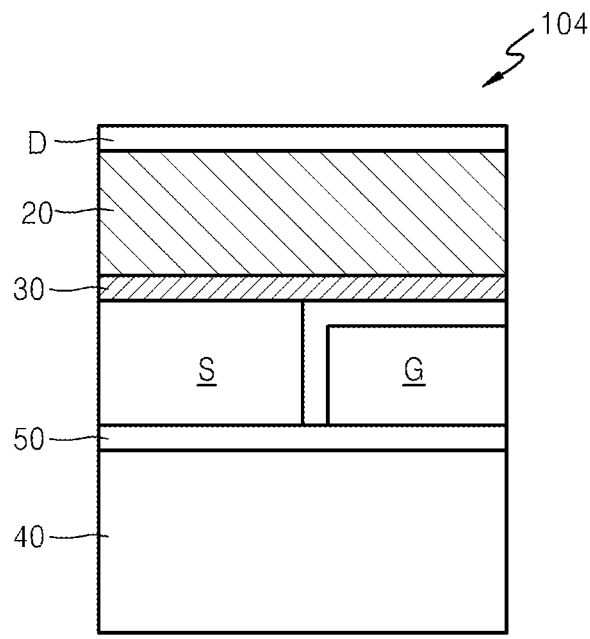
FIG. 5 is a schematic cross-sectional view of a graphene device according to example embodiments.

FIG. 5 is a schematic cross-sectional view of a graphene device 104 according to example embodiments. As shown in FIG. 5, the drain D may be disposed on the active layer 20. Thus, the drain D functions also as the active electrode 70 of the active layer 20.

Figure 6:
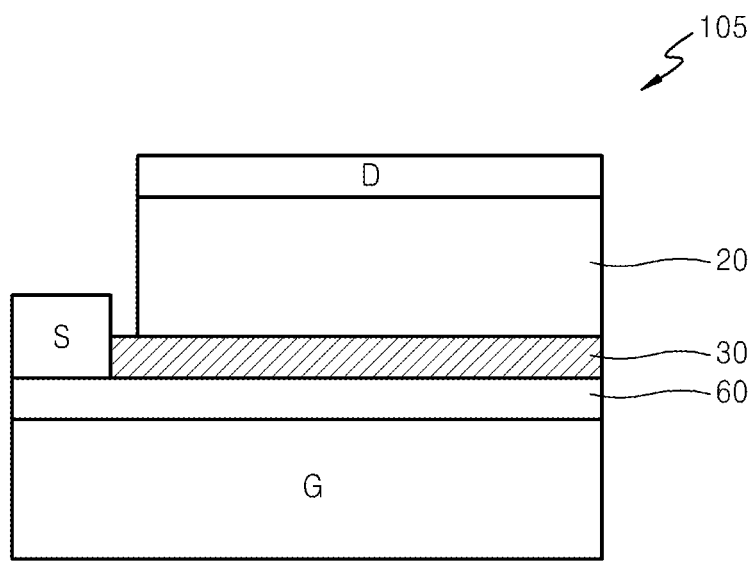
FIG. 6 is a schematic cross-sectional view of a graphene device according to example embodiments.

FIG. 6 is a schematic cross-sectional view of a graphene device, according to example embodiments. As shown in FIG. 6, the gate G and the drain D may be formed on different layers. The entire graphene layer 30 may be formed on the top of the gate G. Also, the gate G itself may be a substrate of the graphene device 105. In detail, the insulating layer 60 may be disposed on the gate G, and the source S and the graphene layer 30 may be arranged on the insulating layer 60. The source S and the graphene layer 30 may be in contact with each other. In addition, the active layer 20 may be formed on the graphene layer 30 and the drain D may be formed on the active layer 20. The gate G may be disposed to be spaced apart from the active layer 30 and the drain D.

The graphene device 105 in which one layer functions as the active electrode 70 and the drain D may further include at least one of the semiconductor layer 80 and the injection layer 90, as in the graphene device 101, 102, and 103 shown in FIGS. 2 through 4.

If the drain D of the graphene devices 104 or 105 is formed of a transparent conductive material (e.g., ITO, AZO, IZO, $SnO_2$ or $In_2O_3$), the graphene devices 104 and 105 may be configured as top emission devices, respectively. On the other hand, if the drain D of the graphene devices 104 or 105 is formed of a conductive material that is opaque and/or has high reflectivity (e.g., a metal material including at least one of platinum (Pt), copper (Cu), argentum (Ag), iridium (Ir), ruthenium (Ru), aluminum (Al), and gold (Au), then the graphene devices 104 and 105 may be configured as bottom emission devices, respectively.

Referring to FIGS. 5 and 6, if graphene layer 30 alternatively contacts the drain D instead of the source S, then a work function of the graphene layer 30 may increase when a positive voltage is applied to the gate G.

Figure 7:
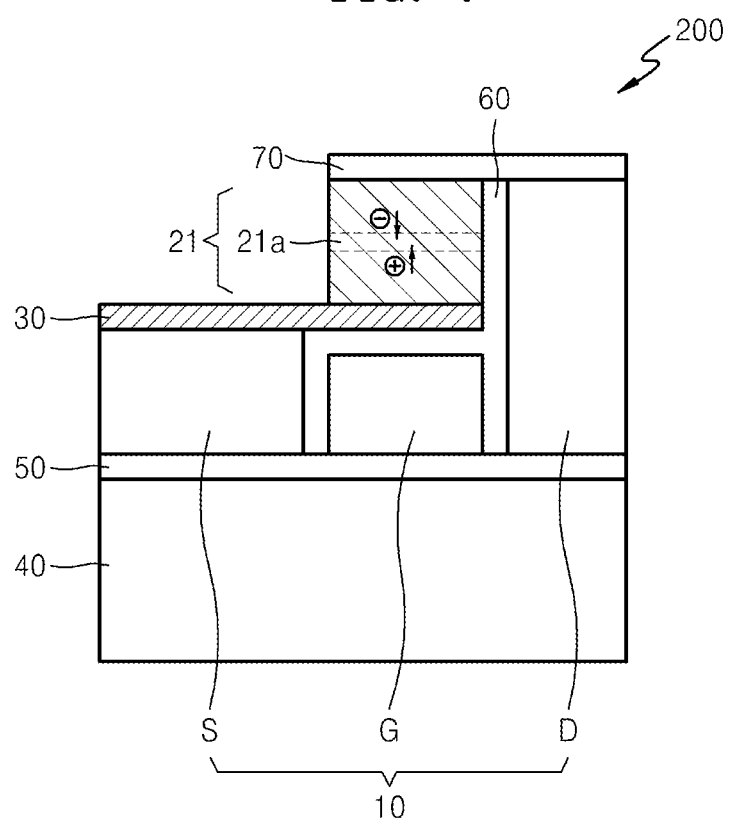
FIG. 7 is a view of a graphene device used as an emission device, according to example embodiments.

Graphene devices 100 to 106 described above and/or 200, 200a, 200b, 107 to 111, and 40, described subsequently, may be used as a device for various electronic apparatuses. For example, the graphene device 100 may be used as an emission device. For example, the graphene device 100 may be an organic emission device, or an emission device of a gallium nitride (GaN) substrate. FIG. 7 is a view of a graphene device used as an emission device according to example embodiments. Comparing FIG. 7 with FIG. 1, an active layer 21 of the emission device 200 shown in FIG. 7 may include an emission layer 21a that emits light. When electrons and holes are injected into the emission layer 21a, pairs of electrons and holes may be formed and dissipate to emit light. The light may be a visible light. The emission layer 21a may include a host material and a dopant material. For example, if the emitted light is green light, the emission layer 21a may be formed by doping tris (8-hydroxyquinolateal uminum) (Alq3) by 1 to 2% as the host, and MQD (n-methylquinacridone) or coumarine by 1 to 2% as the dopant. If the emitted light is blue light, the emission layer 21a may be formed by doping PBD or DPVBi as the host material and perylene, coumarine, or pyrene as the dopant material.

Also, depending on the case, the active layer 21 may further include at least one of a hole injection layer (HIL), a hole transport layer (HTL), an electron transport layer (ETL), and an electron injection layer (EIL). The HIL may be formed of a phthalocyanine compound such as copper phthalocyanine, or starburst-type amines such as TCTA, m-MTDATA, or m-MTDAPB. The HTL may be formed of N,N'-bis(3-methylphenyl)-N,N'-diphenyl-[1,1-biphenyl]-4,4'-diamine (TPD), N,N'-di(naphthalene-1-one)-N,N'-diphenyl benzidine (α-NPD), etc. The EIL may be formed of a material such as lithium fluoride (LiF), sodium chloride (NaCl), cesium fluoride (CsF), lithium oxide (Li2O), barium oxide (BaO), Liq, etc. The ETL may be formed of Alq3.

Alternatively, the active layer 21 may include a GaN and a multi quantum well (MQW), etc. For example, the active layer 21 may be a multi-quantum well structure in which quantum well layers and quantum barrier layers are alternately stacked (e.g., a plurality of InGaN/GaN or GaN/AlGaN layers alternately stacked). However, example embodiments are not limited thereto.

The transistor 10, the graphene layer 30, and the active electrode 70 of FIG. 7 is the same as the transistor 10, the graphene layer 30, and the active electrode 70 of FIG. 1, and thus, their detailed description will not be repeated here. Also, the graphene device 101, 102, 103, 104, and 105 of FIGS. 2 through 6 and 107 to 108 of FIGS. 17-18 may be used the emission device. Furthermore, although not shown in FIG. 7, a sealing member (not shown) may be formed on the active electrode 70. The sealing member may be formed by using an organic or inorganic material.

The graphene layer 30 of the emission device may function not only as a channel layer of the transistor 10 but also as an electrode of the active layer 20. That is, a work function of the graphene layer 30 may change depending on a voltage applied to the gate electrode G, and, the active layer 20 may or may not emit light depending on the change in the work function of the graphene layer 30.

When the graphene layer 30 is used in the emission device, the transistor 10 and the active layer 20 may be arranged to overlap each other, that is, the transistor 10 and the active layer 20 may be vertically arranged, and thus it is possible to increase an aperture ratio.

Figure 8:
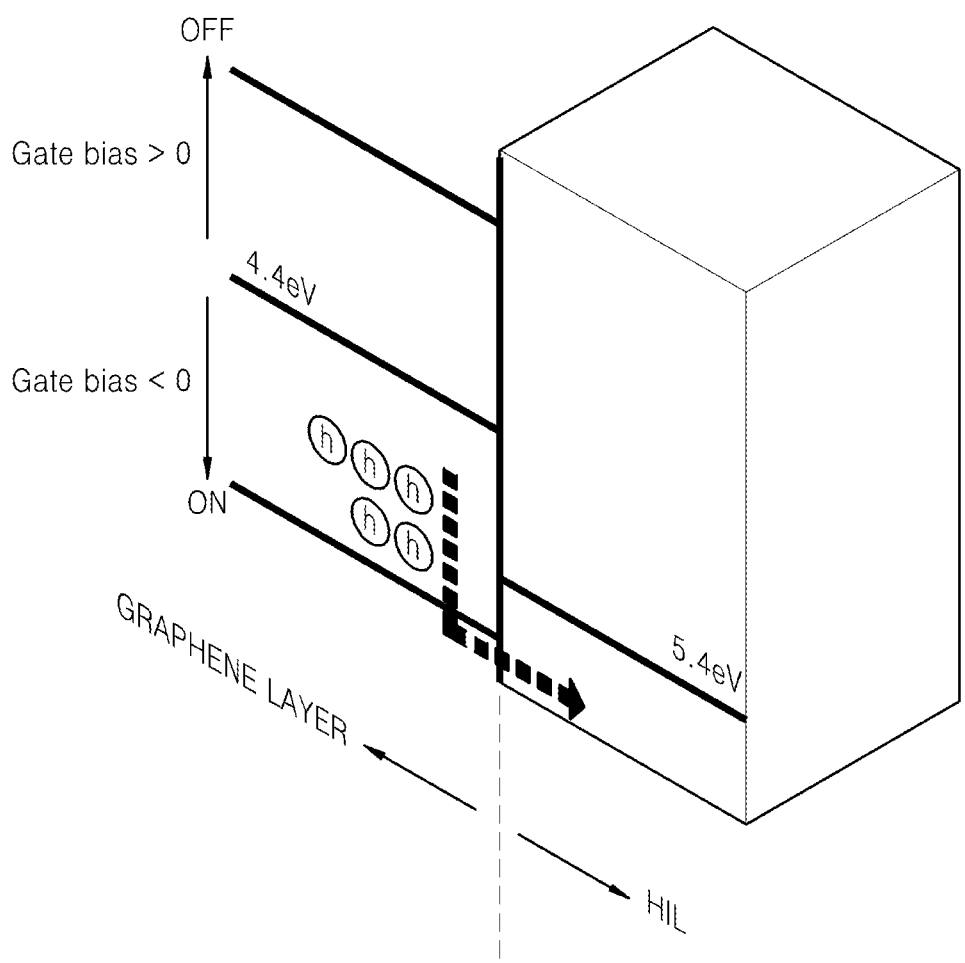
FIG. 8 is a theoretical view of a change in a work function of a graphene layer according to a voltage applied to a gate of a transistor, according to example embodiments.

FIG. 8 is a theoretical view of a change in a work function of a graphene layer according to a voltage applied to a gate, according to example embodiments. As a non-limiting example, the active layer 20 includes a HIL contacting the graphene layer 30.

For example, in the case where a voltage is not applied to the gate electrode G, the work function of the graphene layer 30 becomes about 4.4 eV. In addition, the work function of the HIL of the active layer 20 becomes about 5.4 eV. Here, the HIL may be formed of PEDOT:PSS.

In the case where carriers are holes, if a certain positive voltage +Vg is applied to the gate G in the case where a certain voltage is applied to the source S and the drain D, electrons are induced on the graphene layer 30 and the work function of the graphene layer 30 decreases. Thus, the number of conductive holes decreases, and it becomes difficult for the holes to move to the HIL. Thus, current flow to the active layer 20 decreases.

Meanwhile, if a negative voltage −Vg is applied to the gate G in the case where a given voltage is applied to the source S and the drain D, the number of holes on the graphene layer 30 increases, and the work function of the graphene layer 30 increases. Thus, since the number of conductive holes increases, the current flow to the active layer 20 increases. As the −Vg applied to the gate G decreases, the current flow increases. According to this principle, it is possible to control a turn on voltage of the emission layer (that is, a voltage for emitting light on the emission layer), and the graphene layer may serve not only as the channel of the transistor 10 but also as the electrode of the active layer 20.

Although a description is made with respect to FIG. 8 that the graphene layer 30 functions as anode electrode, the function of the graphene layer 30 is not limited thereto. The graphene layer 30 may also function as a cathode electrode. In such a case, the order in which the material layers are arranged in the active layer 20 may change and the voltage between the source S and the drain D may also change. In addition, light emission may be regulated in amount with the positive voltage of the gate electrode.

Figure 9:
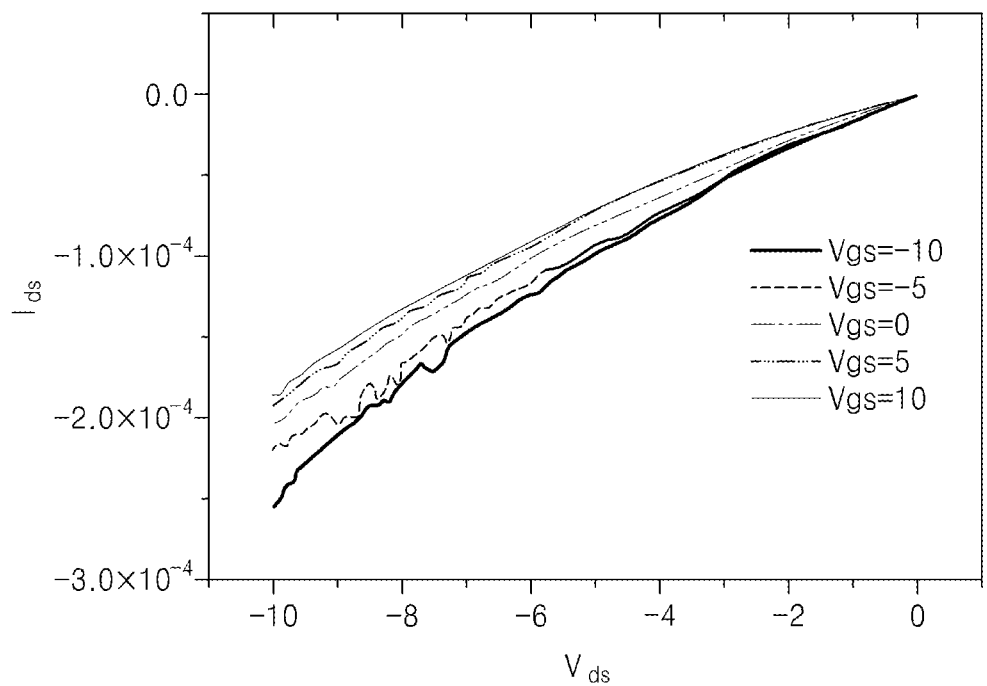
FIG. 9 is a view of a result of a measurement of a change in a drain current according to a voltage applied to a gate of a transistor, according to example embodiments.
Figure 10:
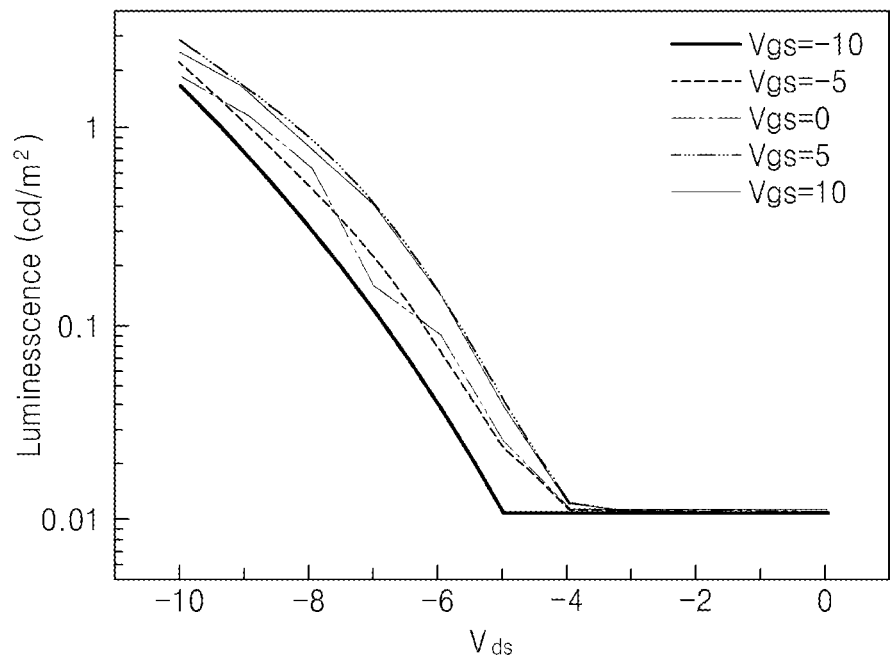
FIG. 10 is a view of a result of an examination of an emission rate in an emission layer according to a voltage applied to a gate of a transistor, according to example embodiments.

In order to check a change of currents of the drain D and an emission rate of the emission layer depending on the gate G, PEDOT:PSS is formed on the graphene layer 30 as the HIL. FIG. 9 is a graph illustrating a change in drain current measured according to a voltage applied to a gate, according to example embodiments. FIG. 10 is a graph illustrating an observed emission rate in an emission layer according to a voltage applied to a gate, according to example embodiments.

As shown in FIG. 9, in the case where a certain voltage is applied between the source S and the drain D, it is understood that as a negative voltage −Vg of the gate G increases, the current that flows in the drain D increases. Also, as shown in FIG. 10, in the case where the voltage of the drain D is about −5V, light emitted by the emission layer may be turned on or off by changing the amplitude of the gate G voltage. This is because the electron mobility in the emission layer changes depending on the change in the gate G voltage.

In addition, the emission device described above may operate as a top emission device or a bottom emission device. This may be determined according to whether the active electrode 70 and the gate G are formed of transmissive materials or not.

Figure 11:
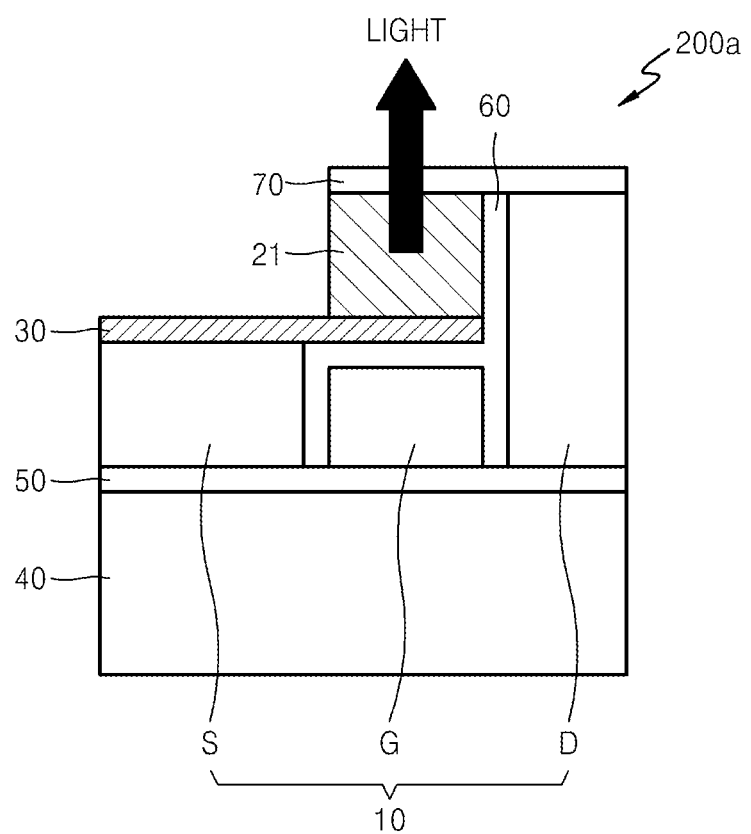
FIG. 11 is a view of when the emission device of FIG. 7 operates as a top emission type, according to example embodiments.
Figure 12:
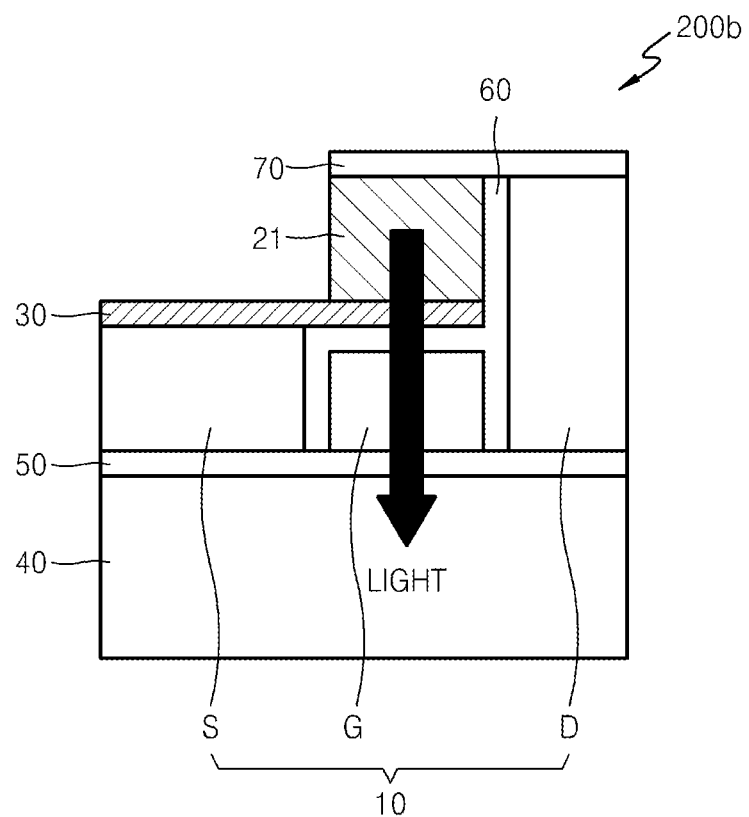
FIG. 12 is a view of when the emission device of FIG. 7 operates as a bottom emission type, according to example embodiments.

FIG. 11 is a view of when the emission device of FIG. 7 is a top emission type device, according to example embodiments. FIG. 12 is a view of when the emission device of FIG. 7 is a bottom emission type device, according to example embodiments.

In order to configure the emission device 200a as a top emission type device, the active electrode 70 may be formed of a transparent metal oxide, such as indium tin oxide (ITO), aluminum zinc oxide (AZO), indium zinc oxide (IZO), tin oxide ($SnO_2$) or $In_2O_3$. In addition, the gate G may be formed of a conductive material that is opaque and has high reflectivity. For example, the gate G may be formed of a metal material including at least one of platinum (Pt), copper (Cu), argentum (Ag), iridium (Ir), ruthenium (Ru), aluminum (Al), and gold (Au). The source S and the drain D may also be formed of the same material as the gate G. Moreover, a reflective layer (not shown) may be further disposed in a direction toward which light is emitted. The reflective layer may be on a top or bottom surface of the graphene layer 30 and may be formed of a conductive layer. The reflective layer may include a material that has high reflectivity (e.g., a metal such as aluminum Al).

In addition, in order to configure the emission device 200b as a bottom emission type device, the gate G may be formed of a transparent metal oxide, such as indium tin oxide (ITO), aluminum zinc oxide (AZO), indium zinc oxide (IZO), tin oxide (SnO2) or In2O3. The source S and the drain electrode D may also be formed of the same material as the gate G. In addition, the gate G may be formed of a conductive material that is opaque and has high reflectivity. For example, the gate G may be formed of a metal material including at least one of platinum (Pt), copper (Cu), argentum (Ag), iridium (Ir), ruthenium (Ru), aluminum (Al), and gold (Au). Moreover, a reflective layer (not shown) may be further disposed in a direction toward which light is emitted.

The foregoing emission device is applied to a display apparatus. It is possible to emit blue, green and red lights by adding fluorescent or phosphorous materials to an organic emissive layer and it is also possible to emit blue, green and red lights by using blue, green and red filters or color conversion materials.

Figure 13:
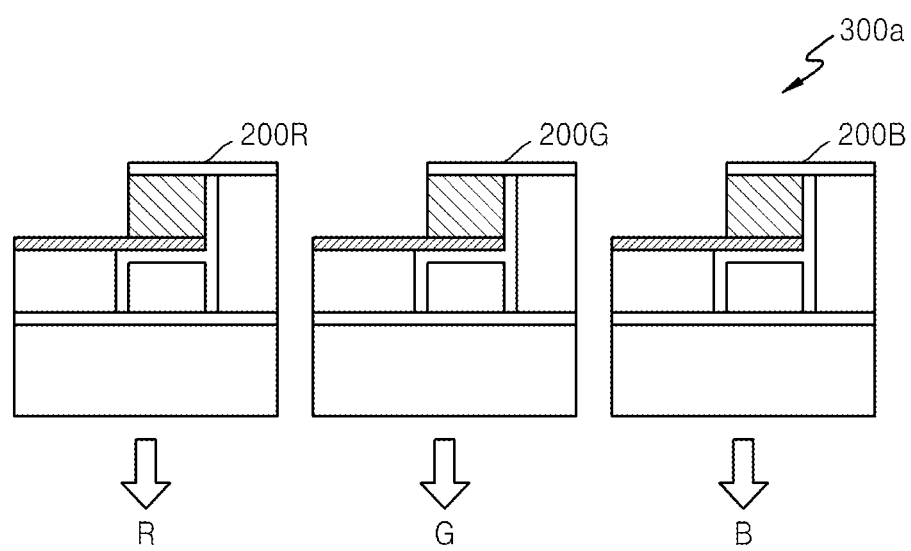
FIGS. 13 to 15 are views of display apparatuses including a plurality of emission devices that operate as a bottom emission type, according to example embodiments.
Figure 14:
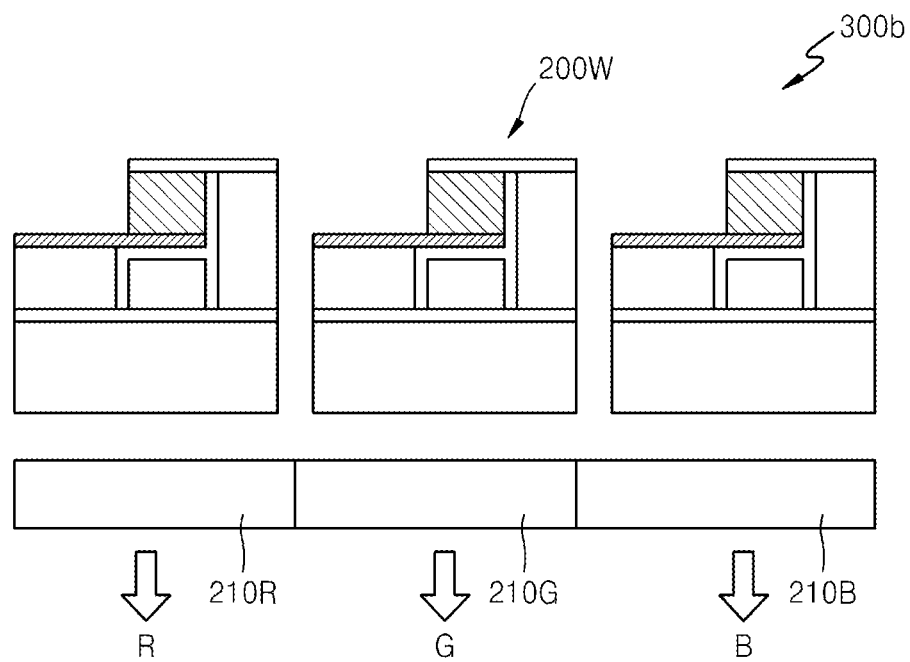
Figure 15:
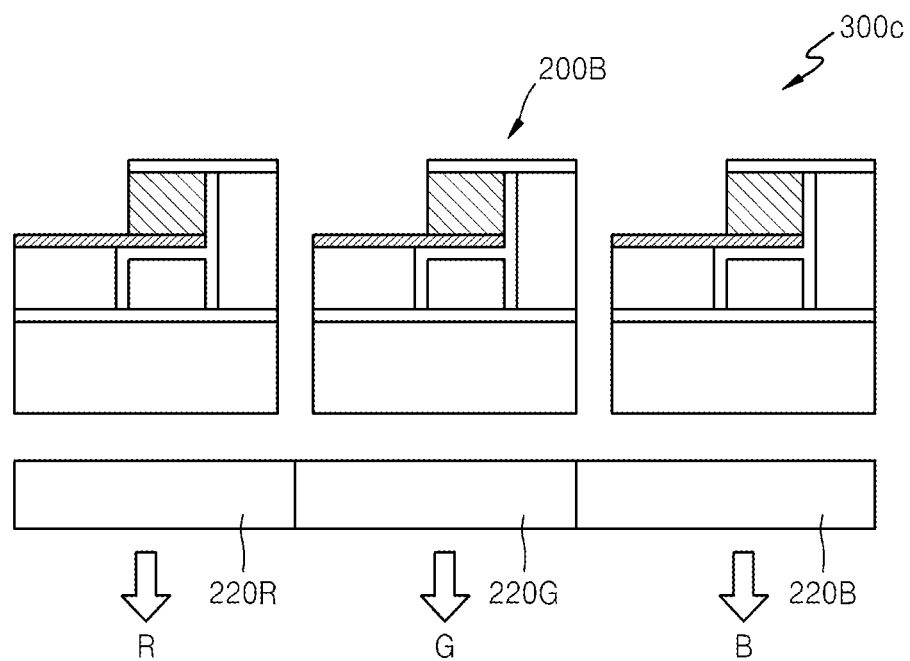

FIGS. 13 to 15 are views of display apparatuses including a plurality of emission devices that are configured as bottom emission type devices, according to example embodiments.

As shown in FIG. 13, a display apparatus 300a may include an array of a plurality of emission devices 200R, 200G, and 200B. For example, the display apparatus 200 may include a first device 200R, a second device 200G, and a third device 200B. The first device 200R may be one of the emission devices according to example embodiments described previously, and may include the active layer 20 emitting a first-color light. The second device 200G may be one of the emission devices according to example embodiments described previously, and may include the active layer 20 emitting a second-color light. The third device 200B may be one of the emission devices according to example embodiments described previously, and may include the active layer 20 emitting a third-color light. The first to third colors may be red, green and blue, respectively. Each of the first to third devices 200R to 200B may emit its specific color by controlling the transistor 10 according to image information.

In addition, a display apparatus 300b may include an array of a plurality of emission devices 200W and color filters 210 for exhibiting colors as shown in FIG. 14. The emission device 200W may be one of the emission devices described previously or a variation of them. The plurality of emission devices 200W may include an active layer for emitting a white light and have color filters 210R, 210G, and 210B that have color regions R, G, and B respectively corresponding to the plurality of emission devices.

Moreover, as shown in FIG. 15, the plurality of emission devices 200R, 200G, and 200B may include an active layer emitting a specific color light except for a white light, and materials that convert specific colors into blue, green and red colors may be respectively arranged on color regions corresponding to the emission devices. For example, the plurality of emission devices may include an active layer emitting a blue light and the color regions may include a transparent layer 220B, a first conversion layer 220G converting a blue light into a green light, and a second conversion layer 220R converting a blue light into a red light.

Figure 16:
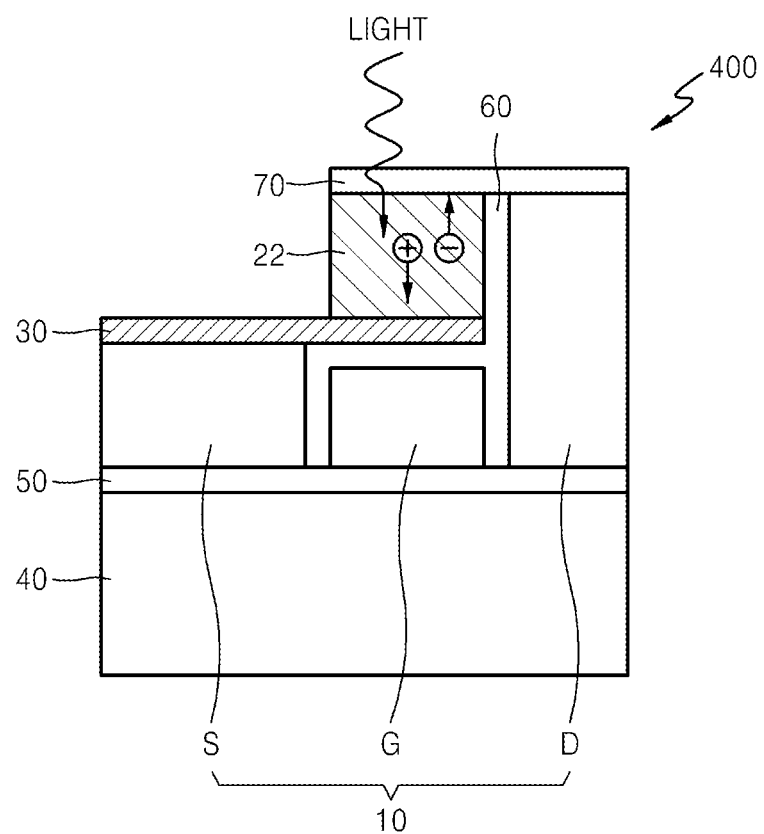
FIG. 16 is a schematic cross-sectional view of a graphene device that operates as a detection device, according to example embodiments.

According to example embodiments, graphene devices may function as a detection device. FIG. 16 is a schematic cross-sectional view of a graphene device that operates as a detection device, according to example embodiments. As shown in FIG. 16, the graphene device 400 may include a transistor 10 including a source S, a drain D, and a cathode, an active layer 22 disposed to be spaced apart from the transistor 10, a graphene layer 30 disposed between the active layer 22 and the transistor 10 and serving as a channel layer of the transistor 10 and an electrode of the active layer 22, and an active electrode 70 contacting the active layer 22 and applying an electric field to the active layer 22 based on a voltage applied to the graphene layer 30.

The active layer 22 in the detection device may be formed of a material that absorbs light and induces a charge transfer. The active layer 22 may include a photoconductive material. For example, the photoconductive material may be any of ZnTe, GaSe, GaAs, ThBr, TlBr, CdTe, Cd1-xZnxTe (CZT), PbO, Pbl$_2$ and Hgl$_2$, but is not limited thereto.

A detection method of the detection device is described as follows. When a high voltage is applied to the active electrode 70, an electric field is formed in the active layer 22. Then, when light, for example, an x-ray, is transmitted into the photoconductive layer, the photoconductive material of the photoconductive layer reacts with the light and is photoelectrically converted so that ionization occurs. Thus, carriers, that is, pairs of electrons and holes may be generated in the photoconductive layer. The electrons and the holes may be separated from each other by the electric field formed in the photoconductive layer. For example, in the case where a high voltage is applied to the active electrode 70, the electrons may move to the active electrode 70 and the holes may move to a region of the active layer 22, which is adjacent to the graphene layer 30. Also, as the amplitude of a voltage applied to the gate G changes, a work function of the graphene layer 30 changes such that the holes move to the graphene layer 30 and are applied to an amplifying unit (not shown) via the drain D. Thus, the detection device may detect light. That is, when a positive voltage is applied to the gate G, the work function of the graphene layer 30 decreases as the electrons are induced. When an energy level of the graphene layer 30 becomes lower than that of the active layer 22, the holes in the active layer 22 may move to the graphene layer 30.

To enhance the detection function, the detection device of FIG. 16 may further include a semiconductor layer (not shown) contacting the graphene layer 30, and an injection layer (not shown) between the graphene layer 30 and the active layer. Although an x-ray detection device is described as the detection device, it is not limited thereto. A detection device for detecting a visible light may be also applied.

Figure 21:
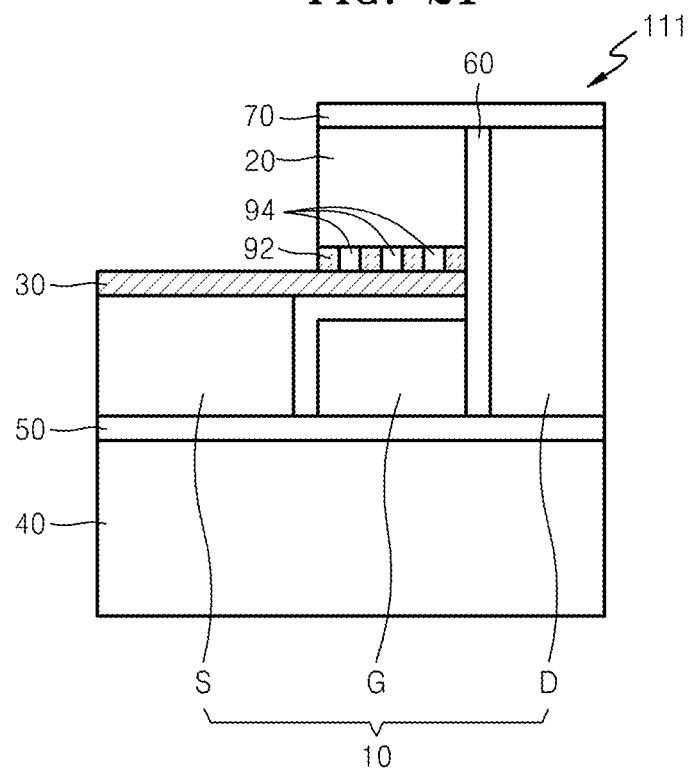

FIGS. 19 to 21 are schematic cross-sectional views of graphene devices according to example embodiments.

Referring to FIG. 19, the graphene device 109 may be the same as the graphene device 102 in FIG. 3, except the graphene device 109 may further include a second injection layer 95 between the graphene layer 30 and the active electrode 70. One of the injection layer 90 and the second injection layer 95 may be a hole injection layer (HIL) and the other of the injection layer 90 and the second injection layer 95 may be an electron injection layer (EIL). The active layer 20 may be between the injection layer 90 and the second injection layer 95.

The HIL may be formed of a phthalocyanine compound such as copper phthalocyanine, or starburst-type amines such as TCTA, m-MTDATA, or m-MTDAPB. The HTL may be formed of N,N'-bis(3-methylphenyl)-N,N'-diphenyl-[1,1-biphenyl]-4,4'-diamine (TPD), N,N'-di(naphthalene-1-one)-N, N'-diphenyl benzidine (α-NPD), etc. The EIL may be formed of a material such as lithium fluoride (LiF), sodium chloride (NaCl), cesium fluoride (CsF), lithium oxide (Li2O), barium oxide (BaO), Liq, etc. The ETL may be formed of Alq3.

Referring to FIG. 20, the graphene device 110 may be the same as the graphene device 109 described above, except the graphene device 110 may further include a semiconductor layer 80 between the injection layer 90 and the graphene layer 30.

Referring to FIG. 21, the graphene device 111 may be the same as the graphene device 100 described above with reference to FIG. 1, except the graphene device 111 may further include electron injection layer portions 92 and hole injection layer portions 94 alternately arranged between the graphene layer 30 and the active layer 20.

Figure 22:
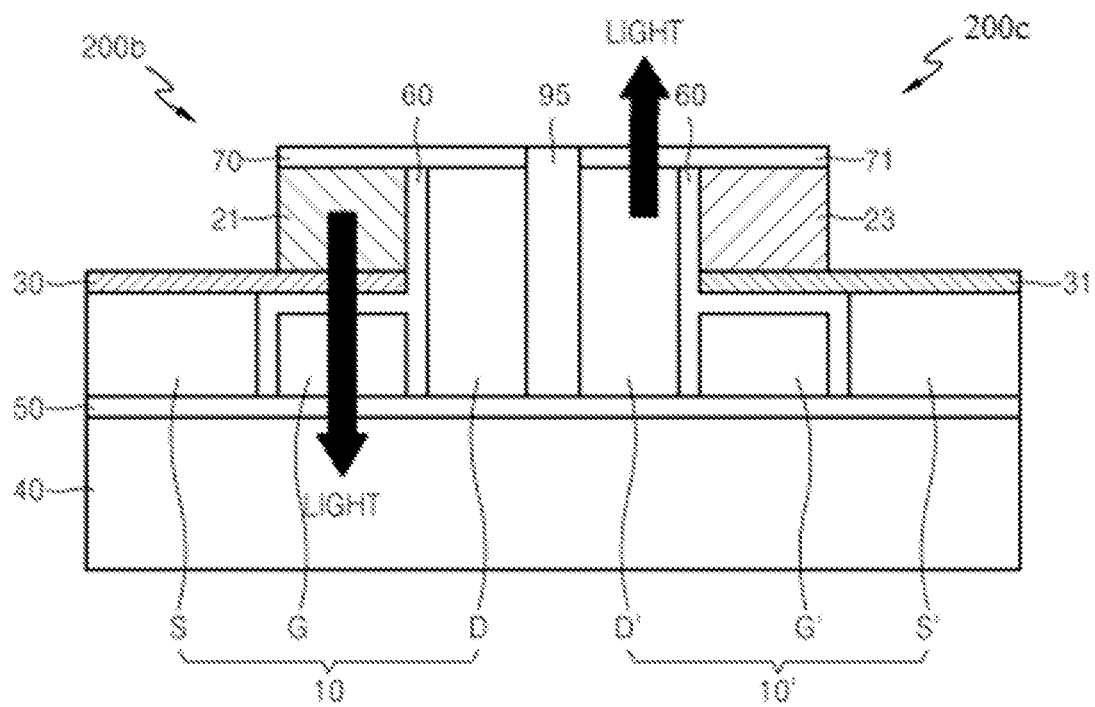
FIG. 22 is a schematic cross-sectional view of a graphene device according to example embodiments.

FIG. 22 is a schematic cross-sectional view of a graphene device according to example embodiments.

Referring to FIG. 22, a graphene device according to example embodiments may include the bottom emission device 200b described previously with reference to FIG. 12 and a top emission device 200c on a common substrate 40. An insulating material 95 may be on the substrate 40 between the bottom emission device 200a and the top emission device 200c. The insulating material may include silicon dioxide, but example embodiments are not limited thereto.

The top emission device 200c may include a transistor 10' including a source S', a gate G', and a drain D', an active layer 23 through which carriers move, and a graphene layer 31 disposed between the gate G' and the active layer 23 and serving as an electrode of the active layer 23 and a channel layer of the transistor 10'. The graphene device 200c may further include an active electrode 71 contacting the active layer 23 and forming an electric field on the active layer 23 due to a voltage applied to the graphene layer 31. Here, the movement of carriers refers to a flow of electrical currents. Also, the active layer 23, the graphene layer 31, and the active electrode 71 or other electrodes, through which the carriers may move, that is, through which currents may flow, may be referred to as providing a pathway for the current flow. The active layer 23 may be between the graphene layer 31 and the active electrode 71.

The source S', the gate G', and the drain D' may be arranged to be spaced apart from one another on the buffer layer 50. The source S', the gate G', and the drain D' may be formed of a conductive material.

In order to limit (and/or prevent) currents from flowing between the gate G' and the source S' and between the gate G' and the drain D', an insulating layer 60 that covers the gate G' may be disposed on the buffer layer 50.

Meanwhile, the graphene layer 31 may be disposed on a region of the insulating layer 60 that faces the gate G'. The graphene is very stable structurally and chemically, has excellent light absorption, and is highly efficient in transducing light into heat and in transferring the heat.

The graphene layer 31 may be disposed to be spaced apart from one of the source S' and the drain D', while contacting the other of the source S' and the drain D'. For example, the graphene layer 31 may extend toward the source S' to contact the source S', and may be disposed to be spaced apart from the drain D'. The graphene layer 31 according to example embodiments is a pathway through which carriers move, and may serve as a channel layer of the transistor 10'.

The active electrode 71 forms an electric field on the active layer 23 due to a voltage formed between the active layer 23 and the graphene layer 31. The active electrode 71 may be electrically connected with the drain D'. The active electrode 71 may be formed of a metal material or conductive oxide. It is illustrated in FIG. 22 that the drain D' and the active electrode 70' are formed as separate layers and are electrically connected to each other while contacting each other, but it is not limited thereto. The drain D' itself may function as the active electrode 71. In this case, the active electrode 71 is not additionally needed.

The active layer 23 may emit or absorb light due to a voltage generated between the graphene layer 31 and the active electrode 71. An energy barrier between the graphene layer 31 and the active layer 23 may be controlled according to a voltage applied to the gate G'.

In order to configure the emission device 200c as a top emission type device, the active electrode 71 may be formed of a transparent metal oxide, such as indium tin oxide (ITO), aluminum zinc oxide (AZO), indium zinc oxide (IZO), tin oxide (SnO2) or $In_2O_3$. In addition, the gate G' may be formed of a conductive material that is opaque and has high reflectivity. For example, the gate G' may be formed of a metal material including at least one of platinum (Pt), copper (Cu), argentum (Ag), iridium (Ir), ruthenium (Ru), aluminum (Al), and gold (Au). The source S' and the drain D' may also be formed of the same material as the gate G'. Moreover, a reflective layer (not shown) may be further disposed in a direction toward which light is emitted.

In addition, in order to configure the emission device 200b as a bottom emission type device, the gate G may be formed of a transparent metal oxide, such as indium tin oxide (ITO), aluminum zinc oxide (AZO), indium zinc oxide (IZO), tin oxide (SnO2) or In2O3. The source S and the drain electrode D may also be formed of the same material as the gate G. In addition, the gate G may be formed of a conductive material that is opaque and has high reflectivity. For example, the gate G may be formed of a metal material including at least one of platinum (Pt), copper (Cu), argentum (Ag), iridium (Ir), ruthenium (Ru), aluminum (Al), and gold (Au). Moreover, a reflective layer (not shown) may be further disposed in a direction toward which light is emitted.

The foregoing emission device may be applied to a display apparatus. It is possible to emit blue, green and red lights by adding fluorescent or phosphorous materials to an organic emissive layer and it is also possible to emit blue, green and red lights by using blue, green and red filters or color conversion materials.

In addition to the active layer described above, graphene devices according to example embodiments may also apply to a device that may implement a specific function based on a movement of carriers, such as a thermoelectric device, a piezoelectric device, or a chemical or biological sensor. The type of active layer is not limited to the type described above. In graphene devices according to example embodiments, the graphene layer 30 may serve a dual function, and thus components of the graphene device may be small. The electrodes of the transistor 10 included in the graphene device may also serve a dual function.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments.

What is claimed is:

1. A graphene device comprising:
   an active layer including one of an emission layer and a photoconductive layer, the emission layer being configured to emit light, the photoconductive layer being configured to react with light and photoelectrically convert light;
   a graphene layer contacting the active layer, the graphene layer and the active layer configured to provide a pathway for current flow; and
   a first electrode spaced apart from the graphene layer, the first electrode configured to control a work function of the graphene layer based on a voltage applied to the first electrode.

2. The graphene device of claim 1, further comprising:
   a second electrode contacting the active layer.

3. The graphene device of claim 2, further comprising:
   a third electrode contacting the graphene layer.

4. The graphene device of claim 3, wherein the third electrode is one of a source electrode of the transistor and a drain electrode of the transistor.

5. The graphene device of claim 1, wherein
   the graphene layer is a channel of a transistor, and
   the first electrode is a gate of the transistor.

6. The graphene device of claim 1, further comprising:
   a second electrode contacting the active layer, wherein a polarity of carriers moving from the active layer to the graphene layer is opposite to a polarity of carriers moving from the active layer to the second electrode.

7. The graphene device of claim 6, wherein the polarity of the carriers moving in the graphene layer changes according to a polarity of a voltage applied to the first electrode.

8. The graphene device of claim 7, wherein
   if the voltage applied to the first electrode is positive, the carriers moving in the graphene layer are electrons, and,
   if the voltage applied to the first electrode is negative, the carriers moving in the graphene layer are holes.

9. The graphene device of claim 1, wherein the first electrode is configured to change an energy barrier between the graphene layer and the active layer, based on the voltage applied to the first electrode.

10. The graphene device of claim 1, wherein the first electrode is configured to increase a movement of holes to the active layer in response to an increase in the work function of the graphene layer if the voltage applied to the first electrode is negative.

11. The graphene device of claim 1, wherein the first electrode is configured to increase a movement of electrons to the active layer in response to a decrease in the work function of the graphene layer if the voltage applied to the first electrode is positive.

12. The graphene device of claim 1, wherein the active layer overlaps at least a portion of the first electrode.

13. The graphene device of claim 1, wherein the active layer includes the emission layer that is configured to emit light.

14. The graphene device of claim 13, wherein the graphene device is an emission device.

15. The graphene device of claim 1, wherein
the active layer includes the photoconductive layer,
the photoconductive layer is configured to react with light, and
the photoconductive layer is configured to photoelectrically convert light.

16. The graphene device of claim 15, wherein the graphene device is configured as a detection device.

17. An electronic apparatus comprising:
the graphene device according to claim 1.

18. A graphene device comprising:
an active layer;
a graphene layer contacting the active layer, the graphene layer and the active layer configured to provide a pathway for current flow;
a semiconductor layer contacting the graphene layer; and
a first electrode spaced apart from the graphene layer, the first electrode configured to control a work function of the graphene layer based on a voltage applied to the first electrode.

19. The graphene device of claim 18, wherein the semiconductor layer is between the graphene layer and the active layer.

20. A graphene device comprising:
a transistor including a source, a gate, and a drain;
an active layer on the gate, the active layer including one of an emission layer and a photoconductive layer, the emission layer being configured to emit light, the photoconductive layer being configured to react with light and photoelectrically convert light; and
a graphene layer between the gate and the active layer,
the graphene layer configured to function both as an electrode of the active layer and a channel layer of the transistor.

21. The graphene device of claim 20, wherein
the graphene layer is in contact with one of the source and the drain, and
the graphene layer is spaced apart from an other of the source and the drain.

22. The graphene device of claim 20, further comprising:
an active electrode contacting the active layer, wherein
the active electrode is configured to form an electric field on the active layer based on a voltage applied to the graphene layer.

23. The graphene device of claim 22, wherein the active electrode is one of the source and the drain.

24. The graphene device of claim 20, wherein the gate is configured to change a work function of the graphene layer according to a voltage applied to the gate.

25. The graphene device of claim 20, wherein the gate is configured to change an energy barrier between the graphene layer and the active layer according to a voltage applied to the gate.

26. The graphene device of claim 20, wherein the active layer includes the emission layer that is configured to emit light.

27. The graphene device of claim 20, wherein
the active layer includes the photoconductive layer.

* * * * *